United States Patent
Haeckl et al.

(10) Patent No.: US 9,988,714 B2
(45) Date of Patent: Jun. 5, 2018

(54) PROCESS FOR PRODUCING POLYSILICON

(75) Inventors: Walter Haeckl, Zeilarn (DE); Barbara Mueller, Erlbach (DE); Robert Ring, Haiming (DE)

(73) Assignee: WACKER CHEM IE AG (DE)

(*) Notice: Subject to any disclaimer, the term of this patent is extended or adjusted under 35 U.S.C. 154(b) by 382 days.

(21) Appl. No.: 13/533,441

(22) Filed: Jun. 26, 2012

(65) Prior Publication Data

US 2013/0011558 A1 Jan. 10, 2013

(30) Foreign Application Priority Data

Jul. 5, 2011 (DE) .................. 10 2011 078 676

(51) Int. Cl.
*C23C 16/00* (2006.01)
*C23C 16/24* (2006.01)
(Continued)

(52) U.S. Cl.
CPC .............. *C23C 16/24* (2013.01); *C01B 33/03* (2013.01); *C01B 33/035* (2013.01); *C01B 33/10778* (2013.01)

(58) Field of Classification Search
CPC . C01B 33/03; C01B 33/035; C01B 33/10778; C01B 33/027; C23C 16/24
(Continued)

(56) References Cited

U.S. PATENT DOCUMENTS 4,526,769 A * 7/1985 Ingle et al. ................... 423/342
2007/0073075 A1 3/2007 Paetzold et al.
(Continued)

FOREIGN PATENT DOCUMENTS

CN 101279178 A 10/2008
CN 101372336 A 2/2009
(Continued)

OTHER PUBLICATIONS

Krishna Murthy, Cost Reduction in Polysilicon manufacturing for Photovoltaics, published on line Apr. 1, 2010, accessed Oct. 26, 2017 from https://hsgkm.files.wordpress.com/2010/04/cost-reduction-in-polysilicon-manufacturing-for-photovoltaics.pdf. (Year : 2010).*

(Continued)

*Primary Examiner* — Kelly M Gambetta
(74) *Attorney, Agent, or Firm* — Caesar Rivise, PC

(57) ABSTRACT

A process for producing polysilicon, includes a) depositing polycrystalline silicon on filaments using reaction gas containing silicon-containing component (SCC) containing trichlorosilane, and hydrogen, wherein molar saturation of SCC based on hydrogen is at least 25%; b) feeding offgas from the deposition into a cooling apparatus, i) wherein condensed offgas components containing $SiCl_4$ are conducted to an apparatus which enables distillative purification of the condensate, and ii) non-condensing components are conducted to an adsorption or desorption unit; c) obtaining a first stream of non-condensing components purified by adsorption and containing hydrogen; and d) obtaining, during adsorption unit regeneration, a second stream of non-condensing components, containing $SiCl_4$ which is then preferably supplied to a converter for conversion of $SiCl_4$ to trichlorosilane. A process for depositing polysilicon on filaments with a reaction gas includes a SCC and hydrogen, wherein molar saturation of SCC based on hydrogen is at least 25%.

12 Claims, 7 Drawing Sheets

(51) Int. Cl.
*C01B 33/035* (2006.01)
*C01B 33/107* (2006.01)
*C01B 33/03* (2006.01)

(58) Field of Classification Search
USPC .......... 427/252, 248.1, 345, 331, 398.1
See application file for complete search history.

(56) References Cited

U.S. PATENT DOCUMENTS

| | | | |
|---|---|---|---|
| 2008/0286550 A1* | 11/2008 | Sofin et al. | 428/220 |
| 2010/0219380 A1 | 9/2010 | Hertlein et al. | |
| 2011/0104035 A1* | 5/2011 | Lovtsus | 423/349 |
| 2011/0268892 A1 | 11/2011 | Oda et al. | |

FOREIGN PATENT DOCUMENTS

| | | |
|---|---|---|
| DE | 1106298 | 11/1961 |
| DE | 2918060 C2 | 8/1987 |
| DE | 102005046703 A1 | 4/2007 |
| DE | 102007047210 A1 | 4/2009 |
| EP | 0133209 A2 | 2/1985 |
| EP | 0305867 A2 | 3/1989 |
| EP | 1992593 A2 | 11/2008 |
| EP | 2298701 A1 | 3/2011 |
| JP | 2006131491 A | 5/2006 |
| WO | 03073794 A1 | 9/2003 |
| WO | 2010090203 A1 | 8/2010 |

OTHER PUBLICATIONS

PatBase abstract for CN 101279178 A.
O'Mara, B. Herring, L. Hunt, Handbook of Semiconductor Silicon Technology, ISBN 0 8155 1237 6, p. 58, Figures 7 and 8.
Abstract for DE 29 18 060 A1.
Abstract for DE 1 106 298 B.
Abstract in English for JP 2006-131491.
PatBase abstract and partial translation of CN101372336.

\* cited by examiner

PROCESS FOR PRODUCING POLYSILICON

BACKGROUND OF THE INVENTION

The invention relates to a process for producing polysilicon.

Polycrystalline silicon (polysilicon for short) serves as a starting material in the production of monocrystalline silicon by means of crucible pulling (Czochralski or CZ process) or by means of zone melting (float zone or FZ process). This monocrystalline silicon is divided into wafers and, after a multitude of mechanical, chemical and chemomechanical processing operations, used in the semiconductor industry for manufacture of electronic components (chips).

More particularly, however, polycrystalline silicon is required to an increased degree for production of mono- or polycrystalline silicon by means of pulling or casting processes, and this mono- or polycrystalline silicon serves for manufacture of solar cells for photovoltaics.

The polycrystalline silicon is typically produced by means of the Siemens process. This involves heating thin filament rods ("thin rods") of silicon by direct passage of current in a bell-shaped reactor ("Siemens reactor") and introducing a reaction gas containing a silicon-containing component and hydrogen.

The polycrystalline silicon can also be produced in the form of granular silicon with specific fluidized bed reactors (FBR), in which case a reaction gas containing a silicon-containing component is introduced from below through nozzles into a reaction chamber, such that a fluidized bed of granular silicon already present forms and the silicon-containing component reacts at the surface of the granular silicon to give silicon.

The silicon-containing component of the reaction gas is generally monosilane or a halosilane of the general composition $SiH_nX_{4-n}$ (n=0, 1, 2, 3; X=Cl, Br, I). Preference is given to chlorosilane or a chlorosilane mixture, particular preference to trichlorosilane.

Predominantly $SiH_4$ or $SiHCl_3$ (trichlorosilane, TCS) is used in a mixture with hydrogen.

Trichlorosilane is preferably obtained via the reaction of metallurgical silicon (MGS—metallurgical grade silicon) with HCl and in subsequent purification in a distillation. Both in Siemens reactors and in FBRs, offgas forms during the deposition, which still contains a considerable amount of silicon-comprising gas. The composition of the gas changes according to the process used. The processing of this offgas is attracting increased industrial attention for reasons of cost.

The prior art discloses methods by which the offgas of the silicon deposition can be processed in principle.

Corresponding cycle processes are described in FIGS. 7 and 8 in O'Mara, B. Herring, L. Hunt, Handbook of Semiconductor Silicon Technology, ISBN 0-8155-1237-6 on page 58.

The offgas from the deposition reactor (Siemens or FBR) is supplied to a twin condensation apparatus, the condensate of which is separated by means of a distillation column into low-boiling and high-boiling components, and the low-boiling components are sent back to the deposition.

The high-boiling components comprise a large portion of silicon tetrachloride (STC), which can be converted to TCS in a conversion apparatus (converter).

The gaseous components of the offgas remaining after the condensation are sent to an adsorption. Here, hydrogen is separated from the other constituents of the gas stream and sent back to the deposition operation. The remaining components are separated in a further condensation into liquid and gaseous components.

The components in liquid form after the condensation are sent to the distillation and used again in the deposition after separation. The gaseous components (labeled "HCl" in FIGS. 7 and 8 in O'Mara) can either be sold as hydrogen chloride (HCl) (cf. FIG. 7 in O'Mara) or reutilized in the initial production (cf. FIG. 8 in O'Mara).

The disadvantage of the processes disclosed in O'Mara is that unwanted substances, for example boron and phosphorus, accumulate in the deposition and thus adversely affect the quality of the silicon deposited.

The "adsorption" already mentioned above is used to purify hydrogen to free it of chlorosilanes still present, and possibly also of HCl.

This involves passing hydrogen contaminated with chlorosilanes and possibly also with hydrogen chloride through a bed of activated carbon at high pressure (pressure between 5 and 20 bar, preferably between 9 and 16 bar) and low temperature (typical order of magnitude $T_1=20°$ C.). Instead of activated carbon, it is also possible to use molecular sieves, as described in DE 1 106 298 B. As well as activated carbon, however, it is also possible to use silicon oxide and aluminosilicates as adsorbers; cf. CN 101279178A.

The impurities are physically and/or chemically adsorbed in the activated carbon.

The activated carbon is "unloaded" by means of a regeneration step after the loading by these unwanted substances. This involves lowering the pressure (typical order of magnitude $P_2=1$ bar) and increasing the temperature (typical order of magnitude $T_2=200°$ C.).

At the high temperature and the low pressure, the gas constituents which were adsorbed beforehand are desorbed, i.e. released into a purge gas.

Typically, the purge gas (hydrogen) is then cooled together with the impurities in order to separate the components which are liquid at low temperatures from the gaseous components. This is known, for example, from DE 29 18 060 A1.

Thereafter, the adsorber is cooled again and is available again for adsorption.

The gaseous components, which in the prior art comprise predominantly HCl, are sent to initial production (cf. FIGS. 7 and 8 in O'Mara).

The liquid components are sent to a distillation in the prior art, wherein low-boiling and higher-boiling components are separated. The low-boiling components are sent to the deposition, and the higher-boiling components to the conversion.

Typically, several adsorbers each in different phases are used in order to ensure continuous adsorption performance.

The number of adsorbers to be used is determined by the residence time in the corresponding phases of "adsorption", "heating", "desorption" and "cooling".

The longer the "adsorption" phase is compared to the other phases, the fewer adsorbers have to be operated in parallel.

In order to reduce the capital costs for the adsorbers, an attempt is usually made to minimize the times of the "heating", "desorption" and "cooling" phases.

The effect of the complete recycling of the low-boiling components from the desorption to the deposition operation, which is disclosed in the prior art, is that impurities such as boron and phosphorus in particular (but also Al, As, C) are collected/enriched in the deposition circuit and thus lead to higher concentrations in the silicon produced.

Although all chlorosilanes are obtained for the deposition operation, the quality of the silicon deposited falls.

It was therefore an object of the invention to provide a process in which the concentration of impurities in the deposition circuit is reduced.

It was a further object to be able to optimally utilize all chlorosilanes in the circuit.

SUMMARY OF THE INVENTION

The first object is achieved by a process for depositing polysilicon on filaments in a deposition reactor by means of a reaction gas including a silicon-containing component and hydrogen, wherein a molar saturation of the silicon-containing component based on the hydrogen is at least 25%.

The molar saturation of the silicon-containing component based on the hydrogen is preferably at least 30%.

The silicon-containing component preferably comprises a halosilane, more preferably a chlorosilane and most preferably trichlorosilane.

The second object is achieved by a process for producing polysilicon, comprising a) deposition of polycrystalline silicon on filaments in a deposition reactor by means of a reaction gas containing a silicon-containing component comprising trichlorosilane, and hydrogen, wherein the molar saturation of the silicon-containing component based on the hydrogen is at least 25%;

b) feeding an offgas from the deposition into an apparatus for cooling the offgas, i) wherein components of the offgas which condense as a result of the cooling and contain STC are conducted to an apparatus which enables distillative purification of the condensate, and ii) components which do not condense in the course of cooling are conducted to an adsorption or desorption unit;

c) to obtain a first stream of those non-condensing components which has been purified by adsorption and contains hydrogen; and d) to obtain, during a regeneration of the adsorption unit by means of desorption and purging with purge gas, a second stream of those non-condensing components, which contains STC and is preferably supplied to a converter for conversion of STC to TCS.

BRIEF DESCRIPTION OF THE DRAWINGS

The processes according to the invention are also illustrated hereinafter by FIGS. 1-7.

DETAILED DESCRIPTION OF PREFERRED EMBODIMENTS

List of Reference Numerals Used

Figure 1:
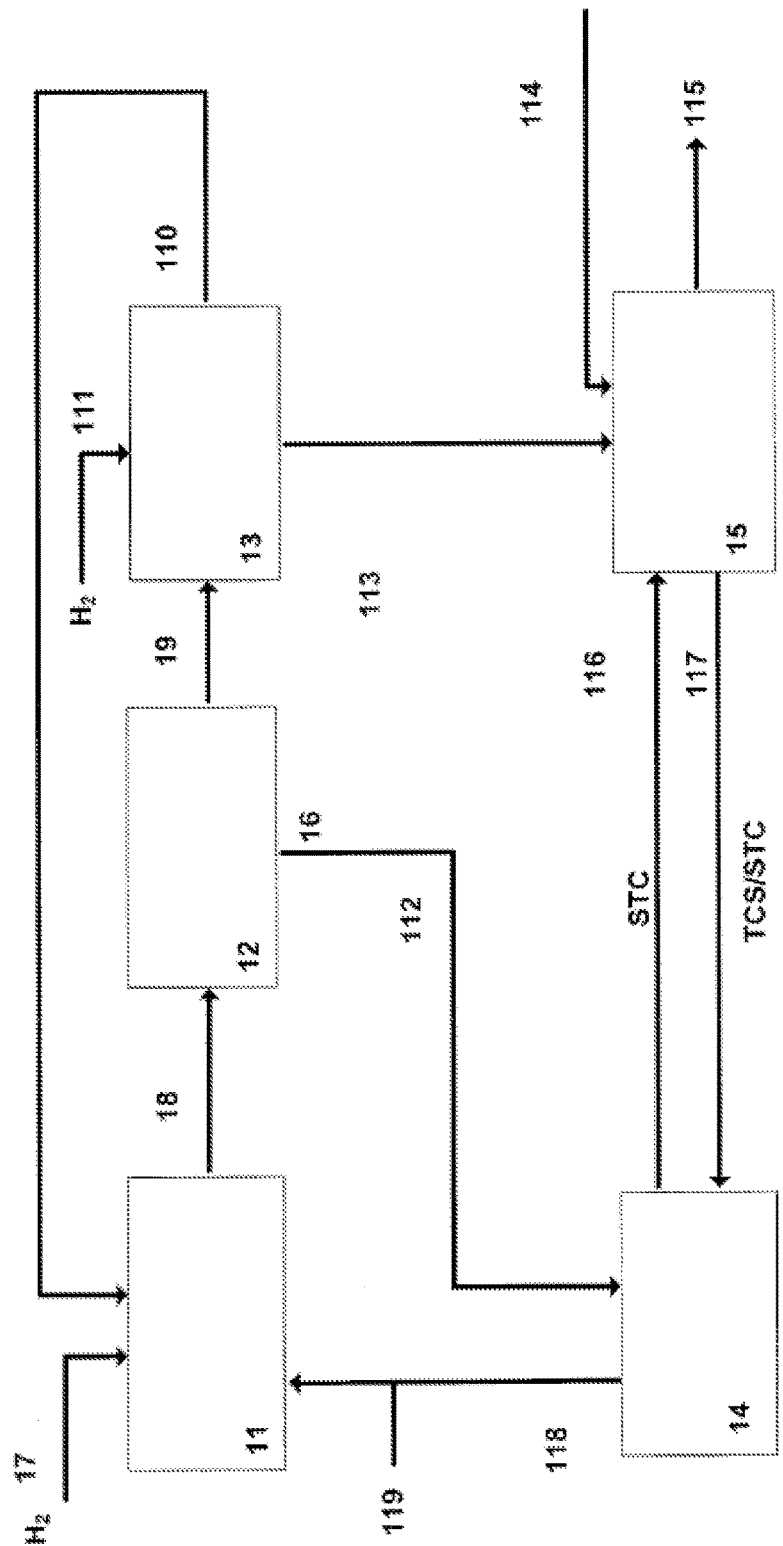
FIG. 1 shows a preferred circuit operation in the context of the invention.

11 Deposition
12 Cooling zone
13 Adsorption/desorption
14 Distillation
15 Conversion
16 Condensate collector
17 Stream comprising fresh hydrogen
18 Offgas stream from the deposition, comprising STC and TCS
19 Stream of the gaseous components remaining after the cooling zone 12
110 Stream comprising reprocessed hydrogen
111 Stream comprising hydrogen as a purge gas for desorption
112 Stream of the condensate formed in the course of cooling
113 Stream obtained by the desorption
114 Stream comprising hydrogen for conversion 15
115 Stream comprising HCl
116 Stream comprising STC
117 Stream comprising STC and TCS
118 Stream comprising TCS intended for reutilization in the deposition 11
119 Fresh TCS-containing stream
21 Stream comprising hydrogen
22 Stream comprising STC
23 Apparatus for conversion
24 Stream comprising DCS
25 Cooling zone
26 Stream of the condensate from the cooling zone 25
27 Stream comprising HCl
41 Deposition
42 Cooling zone
43 Adsorption/desorption
44 Distillation
45 Conversion
46 Condensate collector
47 Stream comprising fresh hydrogen
48 Offgas stream from the deposition, comprising STC and TCS
49 Stream of the gaseous components remaining after the cooling zone 42
410 Stream comprising reprocessed hydrogen
411 Stream comprising hydrogen as a purge gas for desorption, optionally withdrawn from stream 410
412 Stream of the condensate formed in the course of cooling
413 Stream obtained by the desorption
414 Stream comprising hydrogen for conversion 15
415 Stream comprising HCl
416 Stream comprising STC
417 Stream comprising STC and TCS
418 Stream comprising TCS intended for reutilization in the deposition 41
419 Fresh TCS-containing stream
420 Three-way valve
421 Stream to the input side of the cooling zone
422 Stream for conversion
51 Stream comprising hydrogen 52 Stream comprising STC
53 Apparatus for conversion
54 Stream comprising DCS
55 Cooling zone
56 Stream of the condensate from the cooling zone 55
57 Stream comprising HCl
61 Reactant gas stream comprising hydrogen
62 Reactant gas stream comprising silicon tetrachloride (STC)
63 Desorbed gas stream as the third reactant stream into the reaction zone
64 Offgas stream from the converter to the cooling zone
65 Pressure-bearing shell of the reactor
66 Throttle
67 One or more nozzles
WT1 Heat exchanger 1
WT2 Heat exchanger 2
HZ Heating zone of the converter
RZ Reaction zone of the converter
71 Reactant stream comprising hydrogen
72 Reactant stream comprising silicon tetrachloride
73 Desorbed gas stream
74 Product stream comprising trichlorosilane and HCl
75 Inner wall of the pressure-resistant housing, comprising the base and the casing
76 Nozzle circuit for the hydrogen reactant stream
77 Nozzle for desorbed gas stream
78 Heating element
79 Cylindrical gas deflecting elements FIG. 1 shows that the stream 113 obtained by desorption during the regeneration of the adsorber 13 is passed completely to the conversion 15.

For deposition 11, a silicon-containing component (e.g. TCS or DCS) is required, which contains firstly fresh TCS 119 and secondly reutilized TCS 118.

The hydrogen required for the deposition comprises reprocessed hydrogen 110 and, to compensate for the hydrogen losses, also fresh hydrogen 17.

The offgas stream from the deposition 18 is cooled in a cooling zone 12, preferably to a temperature of less than or equal to −60° C., most preferably to a temperature less than the dew point of the HCl at the particular HCl content in the offgas and particular pressure.

The cooling zone 12 preferably comprises various apparatuses for cooling gaseous substances, for example air coolers, coolers operated with cold water, brine coolers or coolers containing other cooling media (ammonia, halogenated hydrocarbons or liquefied gases).

The condensate 112 formed in the cooling zone 12 is collected in one or more condensate collectors 16 and passed to the distillation 14. The task of the distillation 14 is to separate TCS and STC and to supply TCS to the deposition 118 and STC to the conversion 116.

Gas components 19 which do not condense in the cooling zone are passed to an adsorption apparatus 13.

Several adsorbers operated intermittently therein are purged in the course of desorption with a purge gas 111, preferably fresh hydrogen.

The stream 113 thus formed is passed to the conversion 15.

The stream 110 which is purified in the adsorption and comprises principally hydrogen is passed back to the deposition 11.

The stream between deposition, cooling zone, adsorber and finally deposition again is referred to hereinafter as "deposition circuit".

The high-temperature conversion 15 converts STC 116 to TCS 117 with consumption of hydrogen 114. The preferred structure of the converter will be addressed later.

The stream of the product of the conversion 117 comprises, as well as the desired TCS, according to the selectivity of the operation, not inconsiderable amounts of STC.

In addition, the conversion gives rise to a stream of HCl 115, which can be used, for example, for initial production of TCS by chlorination of metallurgical silicon.

The conversion comprises preferably two constituents, namely a conversion reactor and a dedicated cooling zone.

Figure 2:
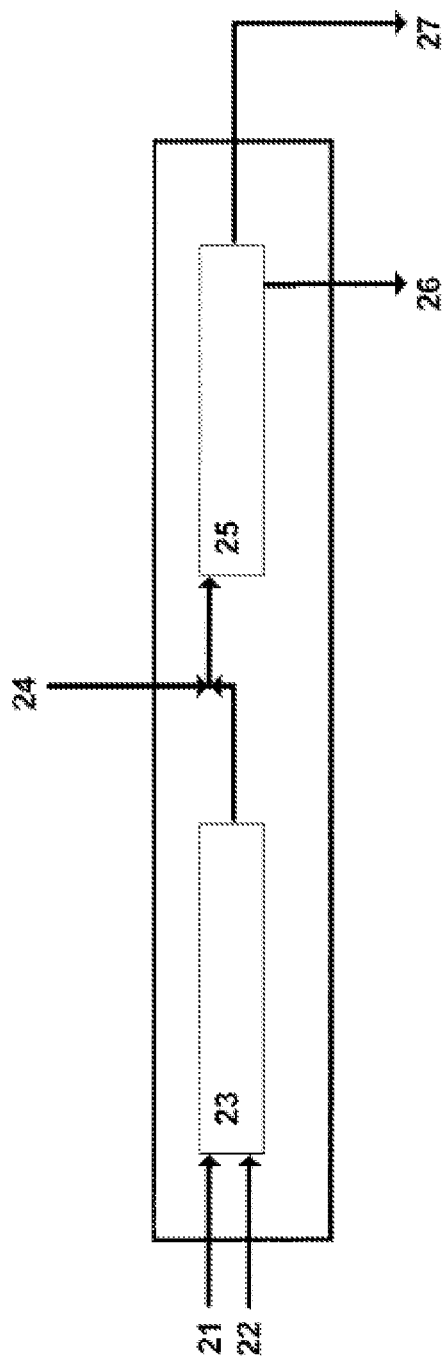
FIG. 2 shows the conversion with gas from the desorption, wherein the gas is supplied between reactor and cooling zone.

FIG. 2 shows the structure of a conversion used with preference.

The stream comprising hydrogen 21 and HCl 22 is conducted into an apparatus for conversion 23. The offgas stream from the conversion is introduced into a cooling zone 25 mixed with the stream from the desorption 24. Downstream of the cooling zone, two streams are obtained: the condensate from the cooling zone 26 and a gaseous component comprising HCl 27.

In this case, it is particularly advantageous that stream 24 is converted in gaseous form.

It is essential to the invention that the molar saturation of the silicon-containing component of the reaction gas, i.e., for example, the trichlorosilane saturation, in the deposition is greater than 25%, preferably greater than 27%, more preferably greater than 29% and most preferably greater than 31%, based in each case on the hydrogen in the reaction gas.

At the same time, an increase in the concentration of unwanted substances, for instance boron or phosphorus, in the deposition circuit is avoided, since they are apparently transported through the desorption to the conversion.

The HCl concentration in the stream from the desorption 24 can surprisingly be adjusted via the saturation used for the silicon-containing component in the reaction gas, i.e., for example, in the chlorosilane stream, in the deposition operation.

Too small a saturation apparently leads to a high HCl concentration.

A relatively low saturation in the deposition apparently leads to an excessively high HCl concentration in the cooling zone of the conversion, and this in turn inevitably requires a larger configuration of the cooling zone and hence a higher capital cost.

One advantage of this method is that all silicon-containing components can be very substantially reutilized.

Figure 3:
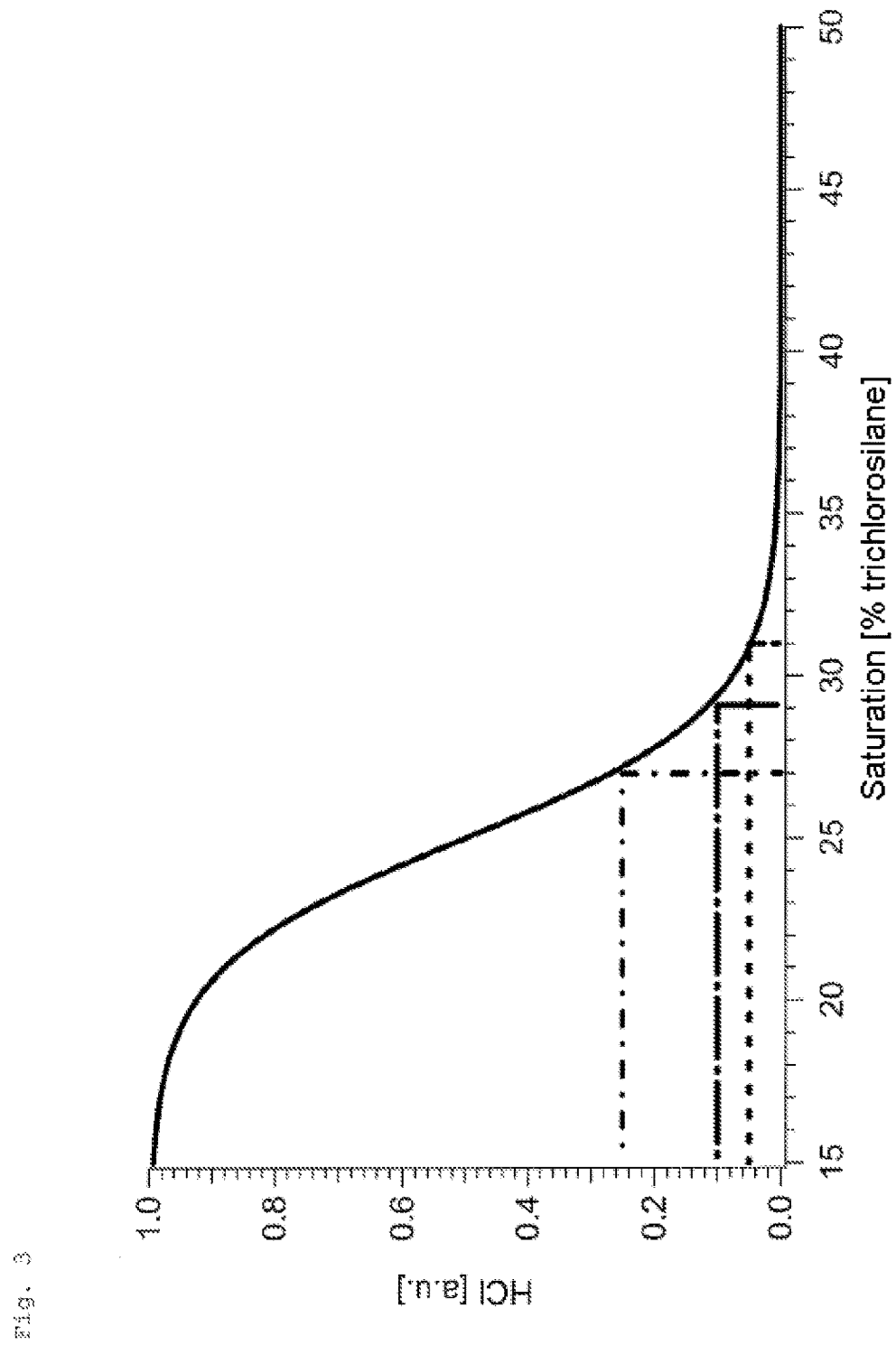
FIG. 3 shows the profile of the HCl concentration in the offgas of the deposition reactor as a function of molar chlorosilane saturation.

Details from an experiment with rising trichlorosilane saturation and measured HCl concentration can be seen in FIG. 3.

The HCl concentration decreases with rising saturation from a saturation of 15%. This point is referred to as the reference point. At smaller saturations, the HCl concentration at first remains virtually constant. At a saturation of 25% or greater, for example, the HCl concentration has fallen to half or less, based on the reference point.

If a saturation of 27% or more is established, the HCl concentration is reduced to a quarter or less, based on the reference point.

From a saturation of 29%, an HCl concentration of less than 10% of the reference point is established.

And from a saturation of 31%, the HCl concentration remains below 5%, based on the reference point.

Figure 4:
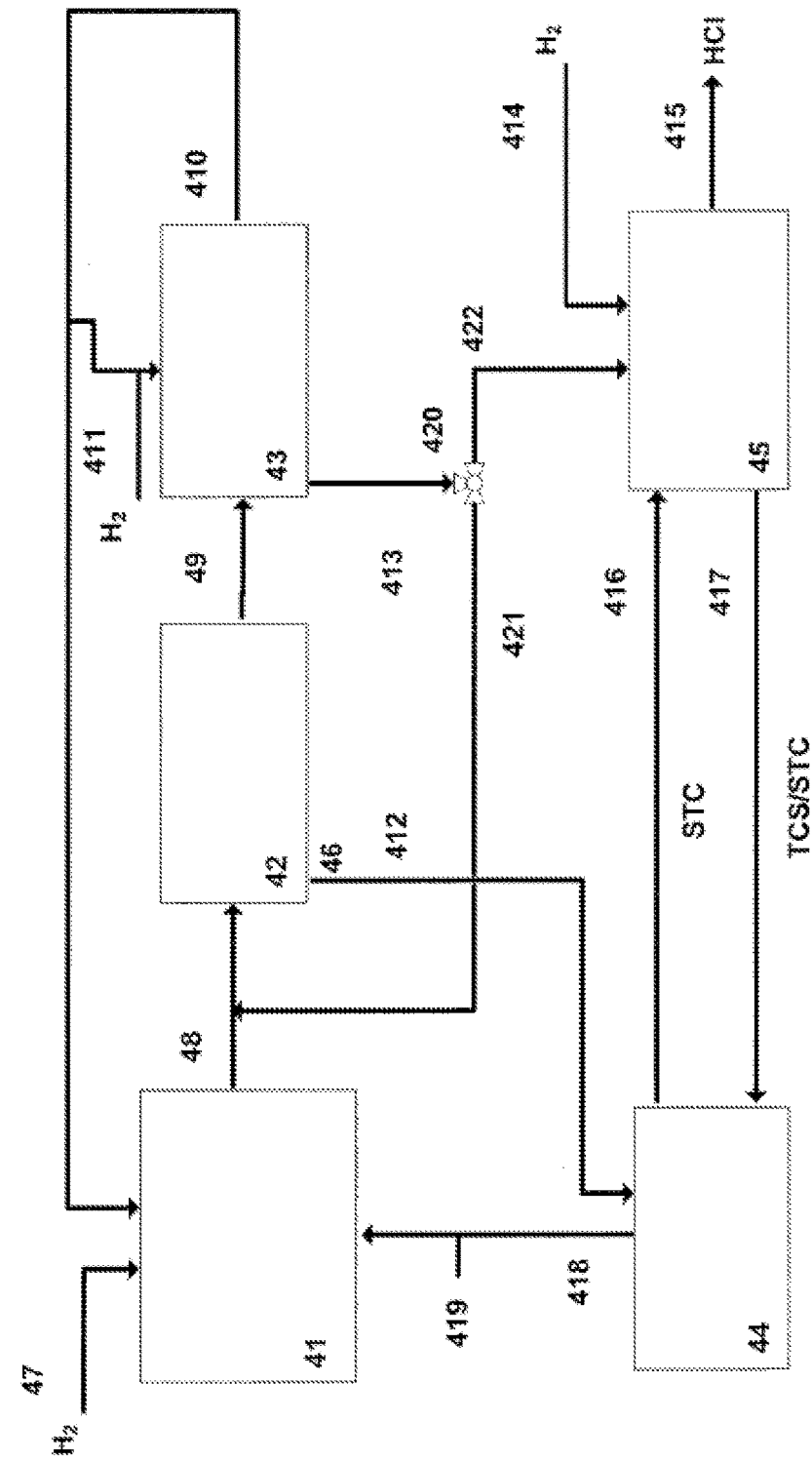
FIG. 4 shows a further preferred circuit operation in the context of the invention.

FIG. 4 shows a further preferred circuit operation in which, during the regeneration of the adsorber 43, the stream 413 obtained by desorption is checked online for the proportion of dichlorosilane (DCS) in the stream by means of a gas chromatograph.

If the molar percentage of DCS is smaller than the proportion of the sum of TCS and STC, the stream is passed through a three-way valve 420 to the input side of the cooling zone 422.

If the proportion is greater, the stream 422 is passed completely to the conversion 45.

Compared to the circuit operation shown in FIG. 1, the following modifications have been undertaken.

Between the adsorber apparatus 43 and the conversion 45, the gas stream is passed in gaseous form through a three-way valve 420 which can pass the gas stream either to the inlet of the cooling zone 421 or to the conversion 422.

The temperature is increased during the desorption at a rate of less than 0.9 K/min.

The starting temperature is about 20° C., the final temperature about 160° C.

A small rate of temperature increase at first means an economic disadvantage.

However, a small rate of temperature increase surprisingly achieves a rough separation between DCS, TCS and STC during the desorption.

For this purpose, the desorbed gas stream from the adsorbers 43 is checked for the content of DCS, TCS and STC with the aid of a measuring device.

The measuring device more preferably comprises a process gas chromatograph.

If the relative proportion of DCS in the gas stream becomes greater than the sum of the STC and TCS gas components, the three-way valve is set such that the gas stream is passed to the conversion.

Otherwise, the gas stream is passed to the inlet of the cooling zone.

A further modification relates to the supply of the adsorbers with purge gas, ideally hydrogen, for purging.

It has been found to be advantageous that, at least in addition, hydrogen is used directly from the deposition circuit 411 as purge gas.

Here, an additional discharge of possible impurities apparently takes place.

Figure 5:
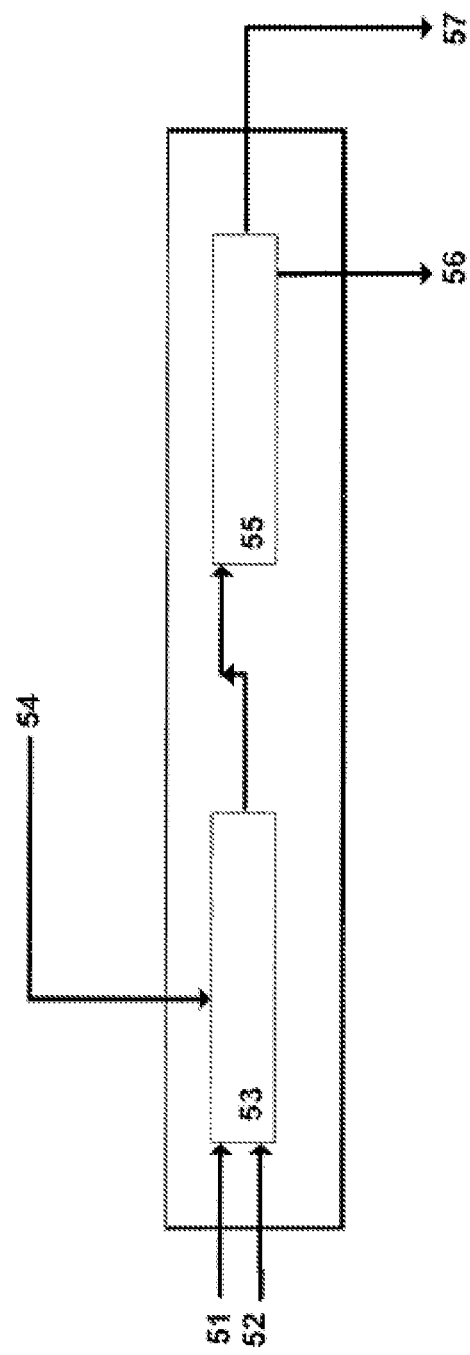
FIG. 5 shows the conversion with gas from the desorption, wherein the gas is supplied directly to the reactor.

FIG. 5 shows a further preferred embodiment, which envisages that the stream 54 obtained by desorption during the regeneration of the adsorber is introduced directly into the conversion reactor 53 (and not between reactor and cooling zone as in FIG. 2). As in FIG. 2, the conversion reactor 53 is supplied with a predominantly H$_2$-containing stream 51 and a predominantly STC-containing stream 52. The product stream formed is separated in a cooling zone 55 into a condensate stream 56 and into a predominantly HCl-containing stream 57.

The gas mixture 54 originating from the desorption (preferably comprising DCS) is introduced in gaseous form directly into the reaction zone of the conversion reactor.

Figure 6:
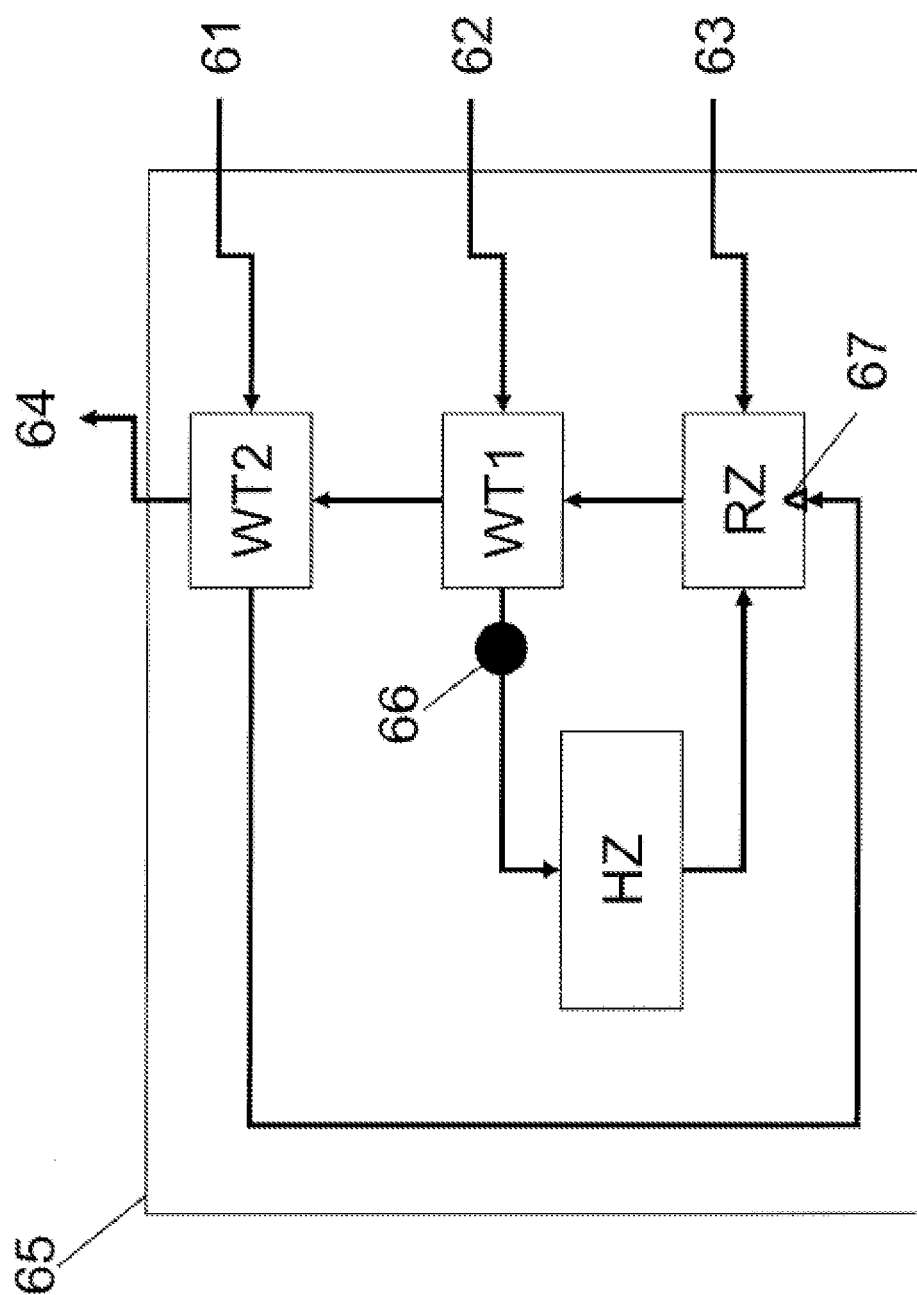
FIG. 6 shows the schematic structure of a converter as utilizable in the context of the invention, especially in the case of direct supply of the desorbed gas to the converter.

Particular preference is given to using a reactor as shown in FIG. 6.

In the "hotter" heat exchanger WT1, which directly adjoins the reaction zone RZ, the reactant gas stream 62 comprising silicon tetrachloride is heated by the offgas from the reaction zone (RZ).

Heat exchanger WT1 consists of graphite, of silicon carbide or of silicon carbide-coated graphite.

An optional but particularly preferred throttle 66, which may consist, for example, of a constriction in a pipeline, of the incorporation of a suitable fitting or of the narrower configuration of the diameter of the pipelines used, ensures a defined pressure differential between the outlet of the heat exchanger WT1 and the heating zone HZ.

In the heating zone, the reactant gas stream 62 is conducted along heating elements, such that the temperature is increased. The heating elements may preferably be constructed as described in DE 10 2005 046 703 A1.

The temperature attained must be higher than that required for the reaction.

This reactant gas stream 62 which has thus been heated and reduced in pressure is introduced into the reaction zone RZ of the reactor.

The reactant gas stream 61 is heated by means of the "colder" heat exchanger unit WT2, which preferably consists of steel or stainless steel, adjoins the heat exchanger unit WT1 and is exposed to the already somewhat colder product gas.

The reactant gas stream 61, after heating in heat exchanger unit WT2, is introduced into the reaction zone via one or more nozzles 67.

The temperature of the reactant gas stream 61 after heating in heat exchanger unit WT2 is lower than the temperature required for the reaction.

The reactant gas stream 61 comprises the hydrogen needed for the reaction in RZ.

Since the product stream has already been cooled sufficiently in heat exchanger unit WT1, the use of steel for heat exchanger unit WT2 is not of concern for process technology purposes.

For space-time yield reasons, the conversion reactor is operated in the elevated pressure range.

The individual reactant streams and also the product stream therefore also have an elevated pressure.

It is therefore advantageous that the heat exchangers, especially the (stainless) steel heat exchangers, are arranged in the pressure-bearing shell of the reactor 65, since the heat exchangers need then have only a low mechanical strength and any possibly slightly leaky site on the heat exchangers cannot mean any escape of product or even a safety risk.

Preference is given to injecting the desorbed gas stream as the third reactant stream 63 via a further central nozzle which has been mounted at the base of the reaction zone.

Figure 7:
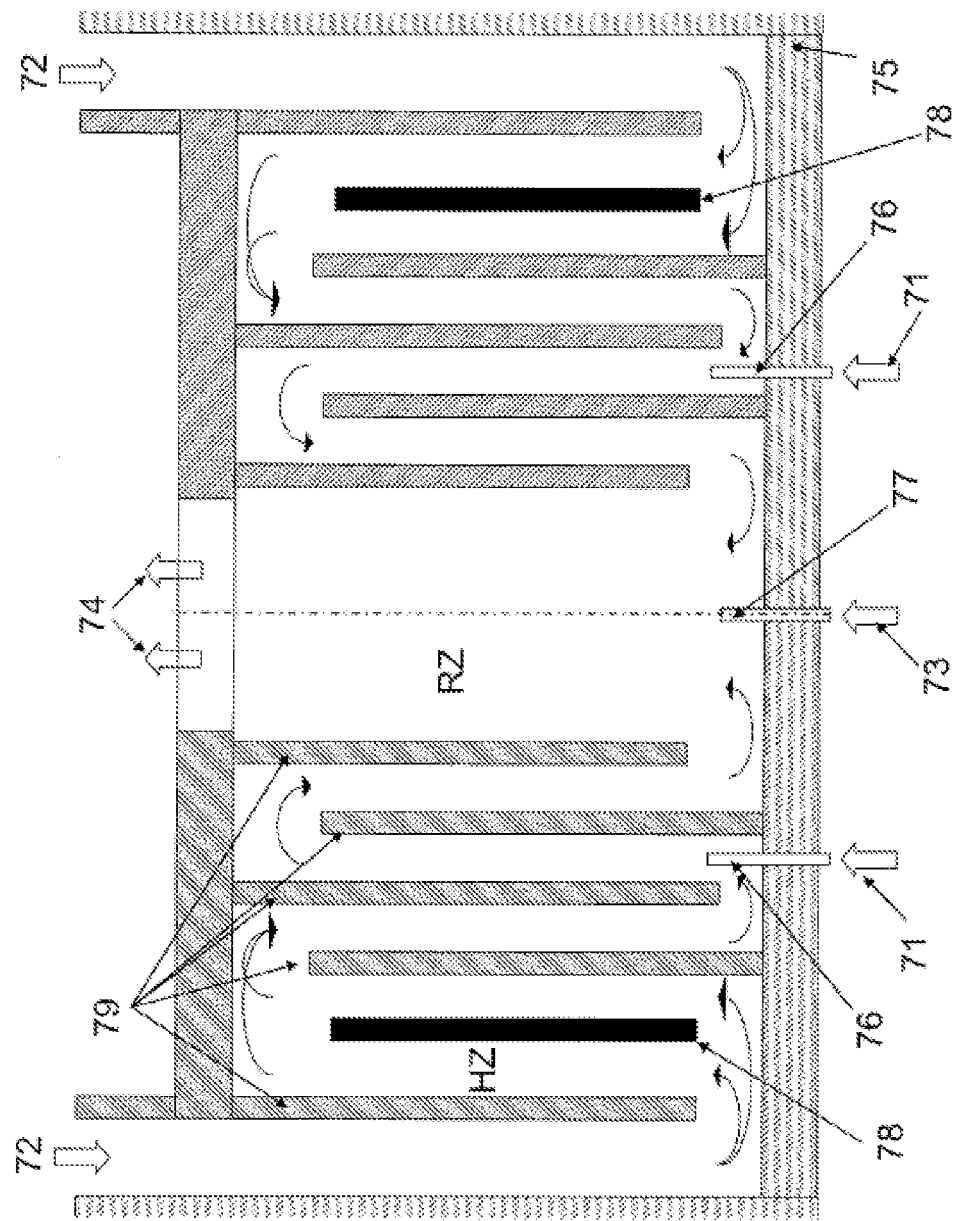
FIG. 7 shows the schematic structure of a converter with heating and deflecting elements, as utilizable in the context of the invention, especially in the case of direct supply of the desorbed gas to the converter.

A corresponding apparatus with additional central nozzle is shown schematically in FIG. 7.

Through the central nozzle 77, the desorbed gas stream 73 is introduced into the reactor in gaseous form, preferably without prior heating.

The reactant stream comprising silicon tetrachloride 72 is conducted along the inner wall of the pressure-resistant housing 75 after passing through a first cylindrical deflecting element 79 to the heating zone, in which there is at least one actively heated heating element 78. For example, this heating element can be designed as an electrical resistance heater, but inductive heating methods are also conceivable.

The heating elements may be distributed individually over the radius, or else it may consist of a crenellated heating band which forms an entire ring, or of several crenellated heating ring components. A detailed description of a crenellated heating element is given in patent specification WO 03/073794 A1.

A cylindrical deflecting element may, without restriction thereto, consist, for example, of a simple hollow graphite cylinder. A deflecting element causes a change in the main flow direction of the gas by 180°.

Said reactant stream is conducted along said heating elements and thus heated to a higher temperature. Thereafter, the reactant stream passes through a second cylindrical deflecting element 79. Only after passing through a third deflecting element 79 is the silicon tetrachloride-containing reactant stream added to a further reactant gas stream 71 comprising hydrogen by means of a nozzle circuit 76. Here, the reaction zone of the apparatus commences, in which the two reactant streams mix and react to give the desired product.

After passing through two further cylindrical deflecting elements 79, a further reactant gas stream, namely the desorbed gas stream 73 comprising dichlorosilane is added to this gas stream by means of a nozzle 77 mounted centrally in the reaction zone. All components of the reactant gas streams can perform the desired reactions with one another here before they leave the reaction zone in the direction of the first heat exchanger unit as product stream 74.

The temperature in the reaction zone (RZ) at which the chemical equilibrium of the reaction is established results from the mixing temperature of the sum of the silicon tetrachloride and hydrogen reactant streams minus the endothermic energy required for the reaction of silicon tetrachloride and hydrogen to give trichlorosilane and HCl.

The gas stream from the desorption is more preferably introduced into the reactor through the central nozzle 73.

This increases the relative selectivity to 165% based on the conversion without use of DCS.

The relative selectivity is given by the molar proportion of trichlorosilane relative to silicon tetrachloride.

The prerequisite is that a chlorosilane saturation of 25%, better 30%, has been used in the deposition.

With a saturation in the deposition of less than 20%, the relative selectivity in the conversion is severely reduced.

The invention claimed is:

1. A process for producing polysilicon, comprising
   a) deposition of polycrystalline silicon on filaments in a deposition reactor, using a reaction gas throughout deposition containing a silicon-containing component comprising trichlorosilane, and hydrogen, wherein a molar saturation of the silicon-containing component based on hydrogen is at least 31%;
   b) feeding an offgas from the deposition into an apparatus for cooling the offgas,
   i) wherein components of the offgas which condense as a result of the cooling and contain silicon tetrachloride are conducted to an apparatus which enables distillative purification of a condensate, and
   ii) non-condensing components which do not condense in a course of cooling are conducted to an adsorption or desorption unit;
   c) obtaining a first stream of the non-condensing components which has been purified by adsorption and contains hydrogen; and
   d) obtaining, during a regeneration of the adsorption unit by desorption and purging with purge gas, a second stream of the non-condensing components, which contains silicon tetrachloride; and
   e) supplying the second stream directly into a conversion reactor for conversion of silicon tetrachloride to trichlorosilane.

2. The process as claimed in claim 1, wherein the offgas in b) is cooled to a temperature of less than or equal to −60° C., optionally to a temperature less than a dew point of HCl at a particular HCl content in the offgas and a particular pressure.

3. The process as claimed in claim 1, wherein the second stream from the desorption in d) is introduced in a gaseous state directly into a reaction zone of the conversion reactor.

4. The process as claimed in claim 1, wherein, in d), the stream from the desorption is studied for a proportion of dichlorosilane in the stream, wherein, if a percentage of dichlorosilane in the stream is greater than a percentage of the sum of trichlorosilane and silicon tetrachloride, the stream is passed to the apparatus for cooling the offgas from the deposition in b) and mixed with the offgas from the deposition.

5. The process as claimed in claim 1, wherein a temperature during the desorption is increased at a rate of less than 0.9 K/min.

6. The process as claimed in claim 1, wherein hydrogen from the first stream purified by adsorption in c) is used as reaction gas in the deposition in a).

7. The process as claimed in claim 1, wherein hydrogen from the first stream purified by adsorption in c) is used as purge gas in the desorption in d).

8. The process as claimed in claim 3, wherein, in d), the stream from the desorption is studied for a proportion of dichlorosilane in the stream, wherein, if a percentage of dichlorosilane in the stream is greater than a percentage of the sum of trichlorosilane and silicon tetrachloride, the stream is passed to the apparatus for cooling the offgas from the deposition in b) and mixed with the offgas from the deposition.

9. The process as claimed in claim 8, wherein a temperature during the desorption is increased at a rate of less than 0.9 K/min.

10. The process as claimed in claim 9, wherein hydrogen from the first stream purified by adsorption in c) is used as reaction gas in the deposition in a).

11. The process as claimed in claim 10, wherein hydrogen from the first stream purified by adsorption in c) is used as purge gas in the desorption in d).

12. A process for producing polysilicon, comprising
   a) deposition of polycrystalline silicon on filaments in a deposition reactor, using a reaction gas throughout deposition containing a silicon-containing component comprising trichlorosilane, and hydrogen, wherein a molar saturation of the silicon-containing component based on hydrogen is at least 31%;
   b) feeding an offgas from the deposition into an apparatus for cooling the offgas,
   i) wherein components of the offgas which condense as a result of the cooling and contain silicon tetrachloride are conducted to an apparatus which enables distillative purification of a condensate, and
   ii) non-condensing components which do not condense in a course of cooling are conducted to an adsorption or desorption unit;
   c) obtaining a first stream of the non-condensing components which has been purified by adsorption and contains hydrogen; and
   d) obtaining, during a regeneration of the adsorption unit by desorption and purging with purge gas, a second stream of the non-condensing components, which contains silicon tetrachloride; and
   e) supplying the second stream directly into a conversion reactor in a reaction zone for conversion of silicon tetrachloride to trichlorosilane in the reaction zone.

\* \* \* \* \*